US006281535B1

(12) United States Patent
Ma et al.

(10) Patent No.: US 6,281,535 B1
(45) Date of Patent: Aug. 28, 2001

(54) THREE-DIMENSIONAL FERROELECTRIC CAPACITOR STRUCTURE FOR NONVOLATILE RANDOM ACCESS MEMORY CELL

(75) Inventors: Shawming Ma, Sunnyvale; Gary W. Ray, Mountain View; Florence Eschbach, Portola Valley, all of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/236,048

(22) Filed: Jan. 22, 1999

(51) Int. Cl.$^7$ .................................................... H01L 29/76
(52) U.S. Cl. ........................ 257/295; 257/303; 257/304
(58) Field of Search .................................. 257/295, 296, 257/298, 301, 303, 304, 306, 311

(56) References Cited

U.S. PATENT DOCUMENTS

| 5,081,559 | 1/1992 | Fazan et al. ......................... 361/313 |
| 5,394,000 | 2/1995 | Ellul et al. ............................ 257/301 |
| 5,618,746 | 4/1997 | Hwang .................................... 438/3 |
| 5,622,882 | 4/1997 | Yee ..................................... 438/210 |
| 5,976,928 | * 11/1999 | Kirlin et al. ......................... 438/240 |
| 6,043,526 | * 3/2000 | Ochiai ................................. 257/295 |

OTHER PUBLICATIONS

Y. Kohyama et al., "A Fully Printable, Self–aligned and Planarized Stacked Capacitor DRAM Cell Technology for 1Gbit DRAM and Beyond," 1997 Symposium on VLSI Technology Digest of Technical Papers, 4–930813–75–1/97, pp. 17–18.

* cited by examiner

Primary Examiner—Olik Chaudhuri
Assistant Examiner—Ginette Peralta

(57) ABSTRACT

A capacitor structure or an array of capacitors and a method of fabricating the structure utilize the contours of a cavity created in a layer stack to form two three-dimensional electrode plates. The three-dimensional electrode plates reduce the lateral size of the capacitor structure. The fabrication of the capacitor structure is compatible to conventional CMOS processing technology, in which the resulting capacitor structure may become embedded in a CMOS device. As an example, the capacitor structure may be fabricated along with a MOS transistor to produce a one-transistor-one-capacitor nonvolatile memory cell. Preferably, the three-dimensional electrode plates are made of platinum (Pt) or iridium (Ir) and the capacitor dielectric is a ferrous-electric material, such as lead-zirconate-titanate (PZT) or barium-strontium-titanate (BST). The electrode plates and the capacitor dielectric are formed by depositing layers of appropriate materials within the cavity, which has been formed to include tapering walls in a dielectric layer of the layer stack. Next, portions of the deposited layers, or a "capacitor stack," are removed down to the surface of the dielectric layer such that only the materials that were deposited within the cavity of the dielectric layer are left. The remaining materials form the electrode plates, as well as the capacitor dielectric. In the preferred embodiment, the selective removal of the capacitor stack portions is accomplished by planarizing the capacitor stack using a Chemical Mechanical Planarization (CMP) process. Alternatively, a sputter etch-back process may be utilized to remove the capacitor stack portions.

18 Claims, 14 Drawing Sheets

THREE-DIMENSIONAL FERROELECTRIC CAPACITOR STRUCTURE FOR NONVOLATILE RANDOM ACCESS MEMORY CELL

TECHNICAL FIELD

The invention relates generally to capacitors and more particularly to a three-dimensional ferroelectric capacitor structure that can be utilized in a nonvolatile memory cell.

DESCRIPTION OF THE RELATED ART

Capacitors are widely used as storage elements in memory arrays fabricated on semiconductor substrates. Common dielectric materials utilized by the capacitors are silicon oxide ($SiO_2$) and silicon nitride ($Si_3N_4$), which have dielectric constants of 4 and 7, respectively. However, due to the low dielectric constants of the silicon oxide and silicon nitride, the miniaturization of a capacitor with a dielectric material of either silicon oxide or silicon nitride is limited. The dielectric material of silicon oxide or silicon nitride is unable to maintain the required storage capacitance when the geometry of the capacitor is decreased below a minimal size. With the increase in demand for high-density memory devices with smaller memory cells, other dielectric materials have been researched as possible candidates to be used as capacitor dielectrics. The use of a ferroelectric material as the capacitor dielectric has emerged as an attractive approach to fabricating capacitors for high-ensity memory devices. The dielectric constant of a ferroelectric can range from 400 to as high as 1400. This implies that a 5 $\mu m^2$ dynamic random access memory (DRAM) cell could be reduced in size by as much as a factor of 20, using a ferroelectric dielectric capacitor structure.

Among the possible electrode materials for the ferroelectric dielectric capacitors, platinum (Pt) has become the most commonly used material. Platinum is highly conductive and tolerant to the processes of depositing and annealing the ferroelectric dielectric. In addition, ferroelectric lead-zirconate-titanate (PZT) devices using Pt electrodes exhibit low leakage current ($<10^{-9}$ amps/cm$^2$). Moreover, Pt promotes the formation of PZT perovskite crystals with orientations which provide the best switching characteristics.

However, several fabrication complications are encountered in patterning the Pt electrodes and the ferroelectric capacitor dielectric. The etching of Pt to form the electrodes is a difficult process because of Pt's high inertness to chemical reaction, typically causing sputter etched Pt residue. The Pt residue can cause severe capacitor leakage. Moreover, the ferrous-electric dielectric is difficult to pattern by a single dry etch process. Multiple steps of patterning a resist layer and dry etching Pt or a ferroelectric material may be required to reduce the capacitor leakage.

A typical ferroelectric capacitor structure utilizes a two-dimensional structure that includes two flat parallel plates as the capacitor electrodes, with a ferroelectric dielectric material sandwiched between the plates. The structure is referred to as "two dimensional" because the height is solely a function of the thicknesses of the plates and dielectric material. That is, the length and width of a two-dimensional capacitor structure are configurable, but the height dimension is merely the sum of the layer thicknesses. For these capacitors, patterned dry etch processes of electrode material and/or ferroelectric material are essential to achieve capacitor cell definition. However, a more recently developed ferroelectric capacitor structure utilizes a three-dimensional structure, i.e., a capacitor structure having at least one layer with a nonplanar configuration.

An article by Kohyama et al., entitled "A Fully Printable, Self-aligned and Planarized Stacked Capacitor DRAM Cell Technology for 1Gbit DRAM and Beyond," 1997 *Symposium on VLSI Technology Digest of Technical Papers*, pp. 17–18, describes a three-dimensional capacitor structure having a ferroelectric dielectric material. The capacitor structure of Kohyama et al. is formed in a cavity in a layer of silicon nitride above a polysilicon plug. A first layer of ruthenium (Ru) is sputtered onto the silicon nitride layer and into the cavity such that the floor and sidewalls of the cavity are covered by the layer of Ru. The layer of Ru is then etched by a Chemical Mechanical Planarization (CMP) process, removing the portion of the layer of Ru outside the cavity. Thus, the layer of Ru is only present on the floor and the sidewalls of the cavity. This first layer of Ru in the cavity serves as the bottom electrode of the capacitor. Next, a ferroelectric dielectric material, barium-strontium-titanate (BST), and Ru are successively sputtered to form a layer of BST and a second layer of Ru. The second layer serves as the top electrode of the capacitor. The second layer of Ru is then patterned by an etch-back process to create a drive line for the capacitor.

Another three-dimensional capacitor structure of interest is described in U.S. Pat. No. 5,394,000 to Ellul et al. The Ellul et al. patent does not explicitly specify that a ferroelectric dielectric may be used as a possible dielectric material for the capacitor dielectric. Instead, silicon oxide is listed as the exemplary dielectric material. The capacitor of Ellul et al. is formed within an etched trench in a substrate. The trench has a main rectangular box-shaped region that is further extended by a smaller rectangular box-shaped region. To fabricate the capacitor of Ellul et al., a layer of dielectric material is deposited over the substrate, forming a cover layer on the bottom and sidewalls of the trench, as well as on surfaces outside the trench. Next, a first conductive layer is deposited above the layer of dielectric material to form the bottom electrode of the capacitor. The first conductive layer completely fills the smaller rectangular box-shaped region of the trench, leaving only a small rectangular trench in the main rectangular box-shaped region. The first conductive layer contained within the smaller rectangular box-shaped region serves as the storage node of the capacitor. A layer of capacitor dielectric material is then deposited over the first conductive layer. Lastly, a second conductive layer is deposited over the layer of capacitor dielectric material. The second conductive layer fills the remaining portion of the small rectangular trench to form the top electrode of the capacitor. Polysilicon is listed as an exemplary material for the conductive layers. After the deposition of the second conductive layer, a CMP process is used to planarize the resulting structure to the top of the trench in order to remove excess materials. The CMP process exposes the top and bottom electrodes and electrical contacts are patterned on the planarized surface for writing and reading electrical charges to and from the capacitor.

Although the known capacitor structures are well suited for their intended purposes, what is needed is a compact three-dimensional ferroelectric capacitor structure that can be efficiently fabricated utilizing a manufacturing process compatible with a conventional CMOS processing technology.

SUMMARY OF THE INVENTION

A capacitor structure or an array of capacitors and a method of fabricating the structure utilize the contours of a cavity created in a semiconductor layer stack to form two three-dimensional electrode plates. The three-dimensional electrode plates reduces the lateral size of the capacitor structure without a significant sacrifice of capacitance. The fabrication of the capacitor structure is compatible with a conventional CMOS processing technology, in which the resulting capacitor structure may be vertically aligned with a CMOS device. As an example, the capacitor structure may be fabricated along with a MOS pass transistor to form a one-transistor-one-capacitor nonvolatile memory cell having a U-shaped configuration that enables high cell density. The pass transistor forms the base of the U-shaped configuration and the two legs are paths from the source/drain regions. The capacitor structure is fabricated to form at least a portion of one of the legs. However, the capacitor structure may be used in other applications.

The three-dimensional capacitor structure is formed by depositing multiple layers of different materials in the cavity. Two of the layers are developed into the three-dimensional electrode plates, while another layer is developed into a capacitor dielectric. Therefore, the shape of the three-dimensional electrode plates conforms to the contours of the cavity, which preferably includes tapering sidewalls and a planar bottom.

Preferably, the three-dimensional electrode plates are made of platinum (Pt), which has a high conductivity. However, other conductive materials may be utilized to form the electrode plates, such as ruthenium (Ru), ruthenium oxide ($RuO_2$), iridium (Ir), iridium oxide ($IrO_2$), and tantalum nitride (TaN). Situated between the electrode plates is the capacitor dielectric. In the preferred embodiment, the capacitor dielectric is a ferroelectric material, such as lead-zirconate-titanate (PZT) or barium-strontium-titanate (BST).

A storage node of the capacitor structure is located below the bottom electrode plate. The storage node is conductively coupled to the bottom electrode plates such that electrical charge is stored in the storage node when the top electrode plate and the storage node are subjected to a potential difference. Preferably, the storage node is made of tungsten (W).

A method of fabricating the capacitor structure of a semiconductor device includes forming the storage node by depositing W into an etched via in a first dielectric layer of a layer stack. The via may be etched by a plasma etching process. After the formation of the storage node, a second dielectric layer is formed atop the first dielectric layer and storage node. Next, a cavity is etched in the second dielectric layer such that the top surface of the storage node is exposed. Plasma etching may be utilized to form the cavity in the second dielectric layer.

The two electrode plates and the capacitor dielectric are then formed within the cavity. Initially, a layer of adhesive material is deposited over the second dielectric layer, including the surfaces of the cavity. Consequently, a portion of the adhesive layer becomes coupled to the top surface of the storage node. The adhesive material may be tin (Ti) or tin nitride (TiN). A layer of first conductive material is deposited over the adhesive layer to form the bottom electrode plate. The adhesive layer conductively bonds the layer of first conductive material to the storage node. The first conductive material is preferably platinum (Pt). Above the layer of first conductive material, a layer of dielectric material is deposited to form the capacitor dielectric. Lastly, a layer of second conductive material is deposited over the layer of dielectric material to form the top electrode plate. The four layers that are formed over the second dielectric layer will be collectively referred to as a "capacitor stack."

In the preferred embodiment, the layer of adhesive material and the layers of conductive material are deposited by sputtering the appropriate material onto a target surface. For example, the layer of first conductive material may be deposited over the adhesive layer by sputtering Pt onto the adhesive layer. In this preferred embodiment, the layer of dielectric material is deposited over the layer of first conductive material by a Metal Organic Chemical Vapor Deposition (MOCVD) process.

After forming the layer of second conductive material, portions of the capacitor stack are removed down to the surface of the second dielectric layer such that only the capacitor stack materials that were deposited within the cavity of the second dielectric layer are left. The remaining capacitor stack forms the top and bottom electrode plates, as well as the capacitor dielectric. In the preferred embodiment, the selective removal of the capacitor stack portions is accomplished by polishing the capacitor stack using a Chemical Mechanical Planarization (CMP) process, effectively planarizing the layer stack down to the surface of the second dielectric layer. Alternatively, a sputter etch-back process may be utilized to remove the selected capacitor stack portions. An electrical contact may be subsequently formed above the top electrode plate to connect the top electrode plate to a low voltage source.

An advantage of the invention is that the use of the cavity in conjunction with the CMP or the dry etch-back process eliminates the need to individually pattern each layer of material to define the electrode plates, the capacitor dielectric and the adhesive layer of the capacitor structure. Another advantage is that the fabrication process of the capacitor structure is compatible with conventional CMOS processing technology. Still another advantage is that the use of the three-dimensional capacitor structure yields semiconductor devices having small geometries, thereby enabling an increase in density of circuitry having multiple capacitor-and-transistor arrangements.

DETAILED DESCRIPTION

Figure 1:
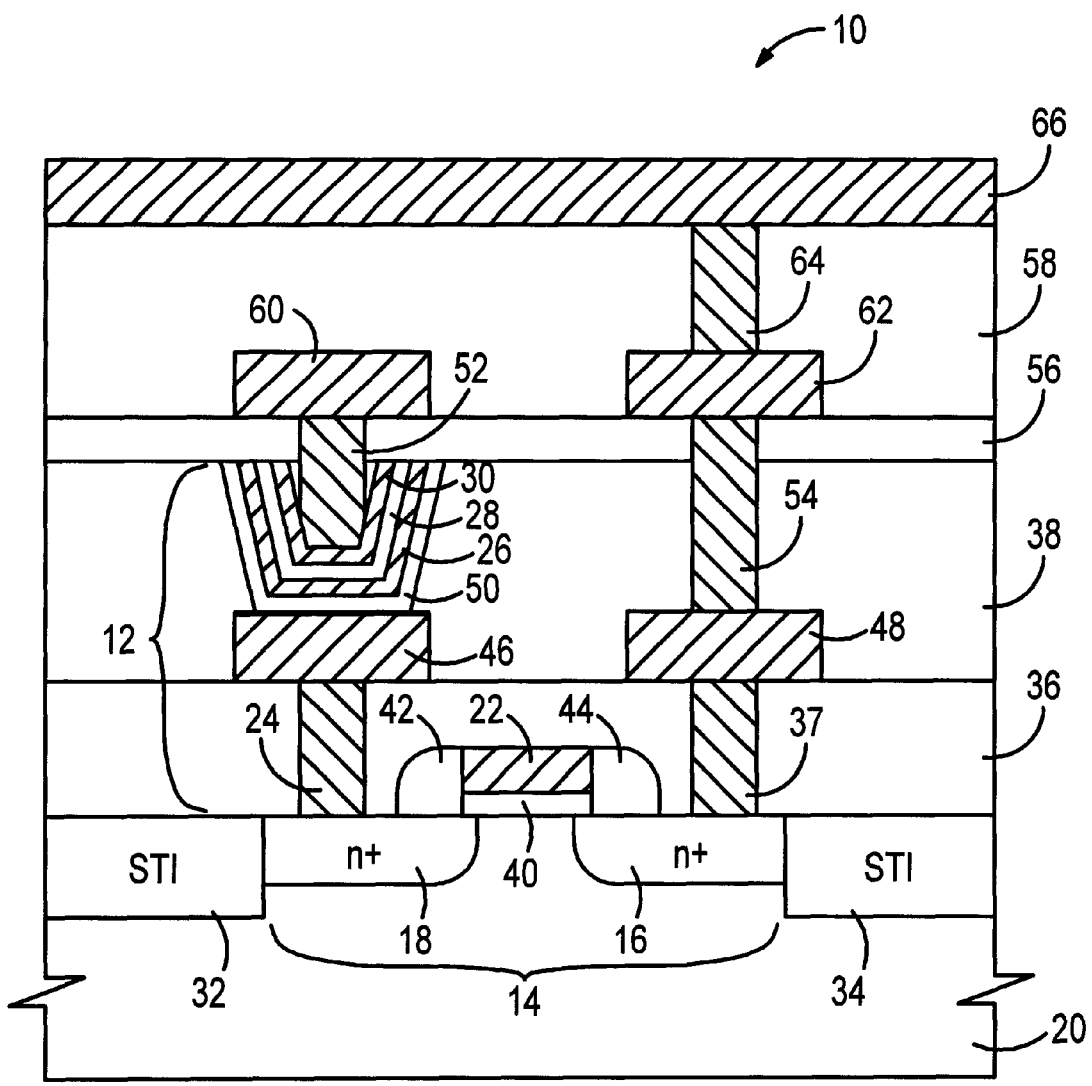
FIG. 1 is a cross-sectional view of a one-transistor-one-capacitor nonvolatile memory cell embodying a capacitor structure in accordance to the present invention.

With reference to FIG. 1, a cross-sectional view of a nonvolatile memory cell 10 embodying an embedded capacitor structure 12 in accordance with the present invention is shown. The nonvolatile memory cell 10 also includes a Metal-Oxide-Semiconductor (MOS) pass transistor 14 defined by a source region 16 and a drain region 18 formed in a substrate 20, and a gate 22. The capacitor structure 12 includes a storage node 24, a bottom electrode 26, a capacitor dielectric 28, and a top electrode 30. Thus, the nonvolatile memory cell 10 is a one-transistor-one-capacitor nonvolatile memory cell.

The nonvolatile memory cell has a U-shaped configuration that promotes cell density in the lateral dimension of the substrate 20. The pass transistor 14 forms the base of the configuration and the two legs are paths to the source region 16 and the drain region 18 of the pass transistor. The capacitor structure 20 forms a portion of the path which originates at the drain region.

The fabrication of the capacitor structure 12 is compatible with conventional CMOS processing technology. Therefore, common CMOS terminologies will be used when applicable. In particular, the terms "dielectric-1," "dielectric-2," "metal-1" and "metal-2" will be used as they are commonly used in CMOS technology.

The substrate 20 contains the source region 16 and the drain region 18, as well as shallow trench isolations (STIs) 32 and 34. The substrate may be a P-type substrate. The "dielectric-1" layer includes a lower dielectric layer 36 and an upper dielectric layer 38. The combination of the two separately formed dielectric layers 36 and 38 is considered to be functionally equivalent to the conventional "dielectric-1" layer, since conductive paths are formed through the nonconductive material in order to connect the drain region 18 of the MOS transistor 14 to a drive line 60 and to connect the source region to a connector 62. The dielectric layers 36 and 38 may be layers of silicon oxide or silicon nitride.

The lower dielectric layer 36 is coextensive with the storage node 24 and a contact plug 37. The storage node 24 and the contact plug 37 may be identical structures. In one possible application, the storage node 24 and the contact plug 37 are cylindrical conductive plugs. Preferably, the storage node 24 and the contact plug 37 are composed of tungsten (W). The dielectric layer 36 also encapsulates the gate 22. Formed between the gate 22 and the substrate 20 is a gate isolation layer 40. Sidewalls 42 and 44 are on opposite sides of the gate. The gate isolation layer 40 and the sidewalls 42 and 44 may be composed of an oxide material.

The upper dielectric layer 38 contains conductive connectors 46 * and 48 that are located above the storage node 24 and the contact plug 37, respectively. The connectors 46 and 48 may be made of aluminum (Al). Positioned above the connector 46 are the bottom and top electrodes 26 and 30 and the dielectric 28. A conductive adhesive layer 50 covers the bottom surface of the bottom electrode 26. The adhesive layer 50 may be made of tin (Ti) or tin nitride (TiN). The adhesive layer 50 ensures that the bottom electrode 26 is properly coupled to the connector 46. The electrodes 26 and 30 are preferably made of platinum (Pt). However, ruthenium (Ru), ruthenium oxide ($RuO_2$), iridium (Ir), iridium oxide ($IrO_2$), or tantalum nitride (TaN) may also be used for the electrodes 26 and 30. In the preferred embodiment, the dielectric 28 is made of a ferroelectric material, such as lead-zirconate-titanate (PZT) or barium-strontium-titanate (BST). Extending from the upper dielectric layer 38 are contact plugs 52 and 54. The contact plug 52 is conductively coupled to the top electrode 30, while the contact plug 54 is conductively coupled to the connector 48. The contact plugs 52 and 54 are preferably made of W.

In an alternative embodiment, the connectors 46 and 48 are not utilized. Instead, the electrodes 26 and 30, the dielectric 28, and the adhesive layer 50 are elongated downwardly to couple the adhesive layer 50 directly to the storage node 24. Similarly, the contact plug 54 is elongated to directly couple the contact plug 37. Consequently, the connectors 46 and 48 are not critical to the invention.

A diffusion layer 56 separates the upper dielectric layer 38 and a dielectric layer 58. The dielectric layer 58 is functionally equivalent to the conventional "dielectric-2" layer for traditonal CMOS devices. The diffusion layer 56 and the dielectric layer 58 may be layers of silicon oxide or silicon nitride. The contact plugs 52 and 54 extend through the diffusion layer 56. Contained in the dielectric layer 58 are the drive line 60 and the conductive connector 62. The drive line 60 and the connector 62 are "metal-1" elements for traditional CMOS devices. The drive line 60 and the connector 62 are preferably made of aluminum (Al). The dielectric layer 58 also contains a contact plug 64 that connects the connector 62 to a bit line 66. Similar to other contact plugs, the contact plug 64 may be made of W. The bit line 66 is formed over the dielectric layer 58. The bit line 66 is the "metal-2" element for traditional CMOS devices. The bit line 66 may be composed of Al or copper (Cu).

In operation, the capacitor structure 12 stores a bit of data as an electrical charge. A high electrical charge can represent a digital "1", while a low electrical charge can represent a digital "0". Data is stored in the nonvolatile memory cell 10 by applying a high or low voltage on the bit line 66, depending on the data to be stored. If a "1" is to be stored, a high voltage is applied to the bit line 66. If a "0" is to be stored, the bit line 66 is applied with a low voltage. Next, a voltage is applied to the gate 22 to conductively connect the bit line 66 to the capacitor structure 12. The voltage on the gate 22 activates the MOS transistor 14, allowing charge to cross from the source region 16 to the drain region 18. The capacitor structure 12 builds up electrical charge caused by the voltage difference between the top and bottom electrodes 30 and 26. When the voltage on the gate 22 is removed, the electrical charge in the capacitor structure 12 is trapped, or stored. The stored electrical charge may then read by activating the MOS transistor 14 and sensing the stored charge on the bit line 66.

Figure 2:
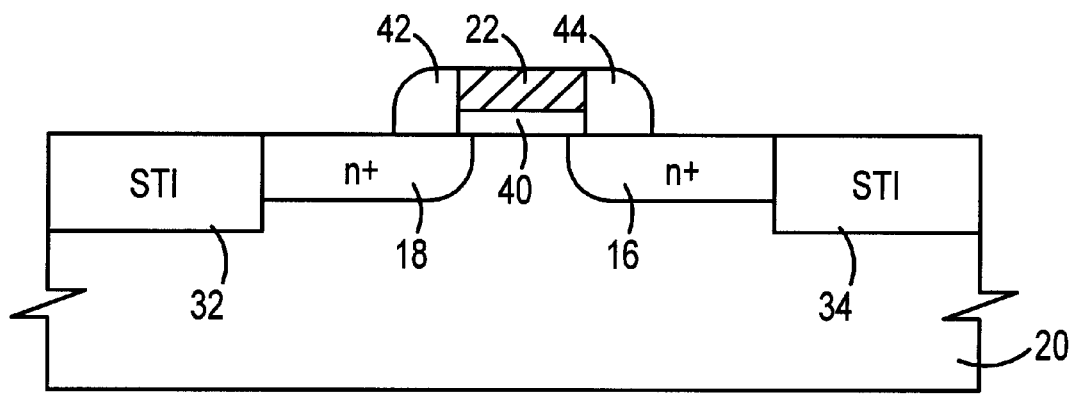
FIGS. 2–21 are cross-sectional views of an unfinished semiconductor device, illustrating various steps of a method of fabricating the nonvolatile memory cell of FIG. 1 in accordance to the present invention.

FIGS. 2–21 are cross-sectional views of an unfinished semiconductor device, illustrating various steps of the method of fabricating the embedded capacitor structure 12. In FIG. 2, the MOS transistor 14 has been formed on the substrate 20. The formation of the regions 16 and 18, the STIs 32 and 34, the gate isolation layer 40, the gate 22 and the sidewalls 42 and 44 is accomplished utilizing conventional CMOS procedures. Therefore, the fabrication process of forming the elements shown in FIG. 2 will not be described herein.

Figure 3:
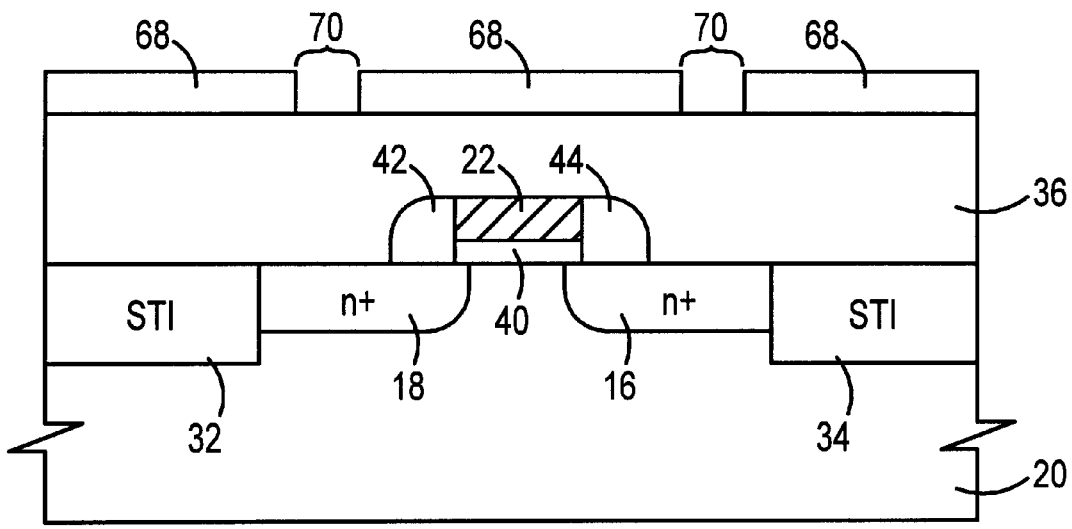
Figure 4:
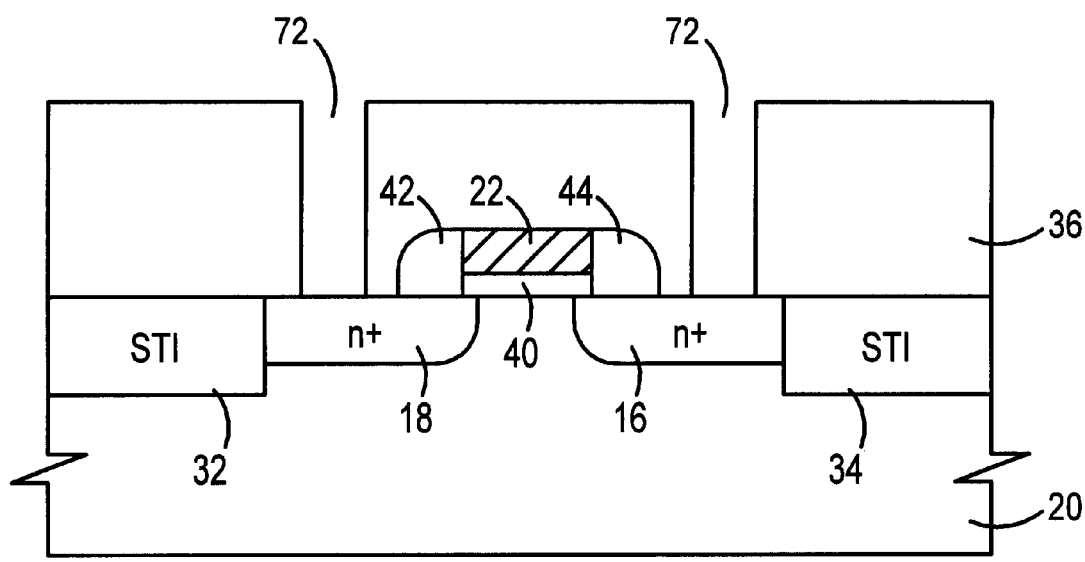

After the formation of the sidewalls 42 and 44, a layer of silicon oxide is formed over the substrate 20 to create the dielectric layer 36, as shown in FIG. 3. The dielectric layer 36 is then planarized, for example, by a CMP process. After the planarization, a photoresist layer 68 is deposited over the dielectric layer 36 and patterned by a conventional photoresist imaging process. The resulting patterned photoresist layer 68 includes exposed regions 70. Next, the dielectric layer 36 is dry etched to form vias 72 at the regions 70, as shown in FIG. 4. As an example, a plasma etching technique may be utilized to form the vias 72 in the dielectric layer 36. Following the formation of the vias 72, the resist layer 68 is removed.

Figure 5:
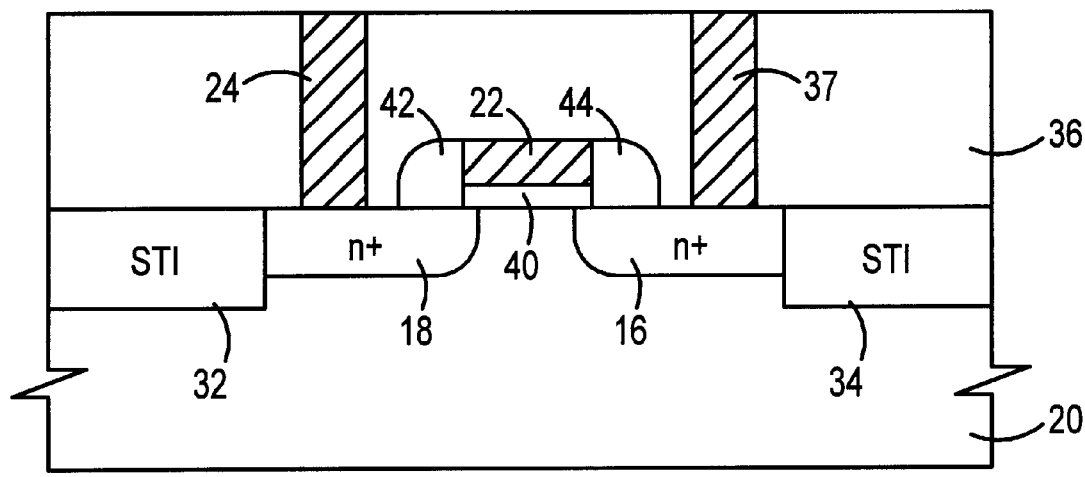
Figure 6:
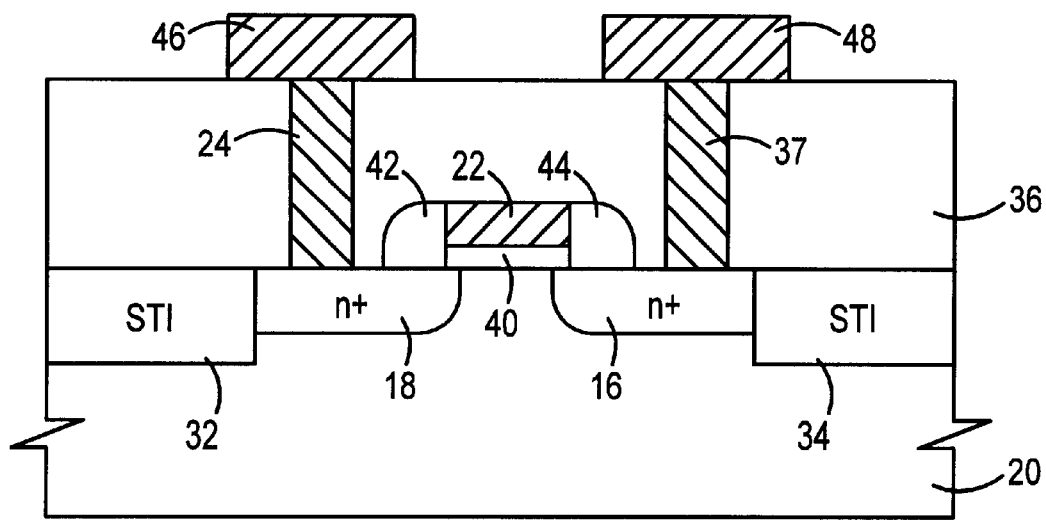

Next, the vias 72 are filled with W to form the storage node 24 and the contact plug 37 by depositing W over the dielectric layer 36. Excess W on the surface of the dielectric layer 36 and above the vias 72 is removed by a CMP process, resulting in a planarized surface, as shown in FIG. 5. Following the formation of the storage node 24 and the contact plug 37, a layer of Al is deposited over the lower dielectric layer 36 and then etched to form the conductive connectors 46 and 48 of FIG. 6. Etching of the Al layer is a well known process and thus will not be described here. After the formation of the connectors 46 and 48, a layer of silicon oxide is formed over the lower dielectric layer 36 and the connectors 46 and 48 to create the upper dielectric layer 38 of FIG. 7. The surface of dielectric layer 38 is then planarized by a CMP process.

Figure 7:
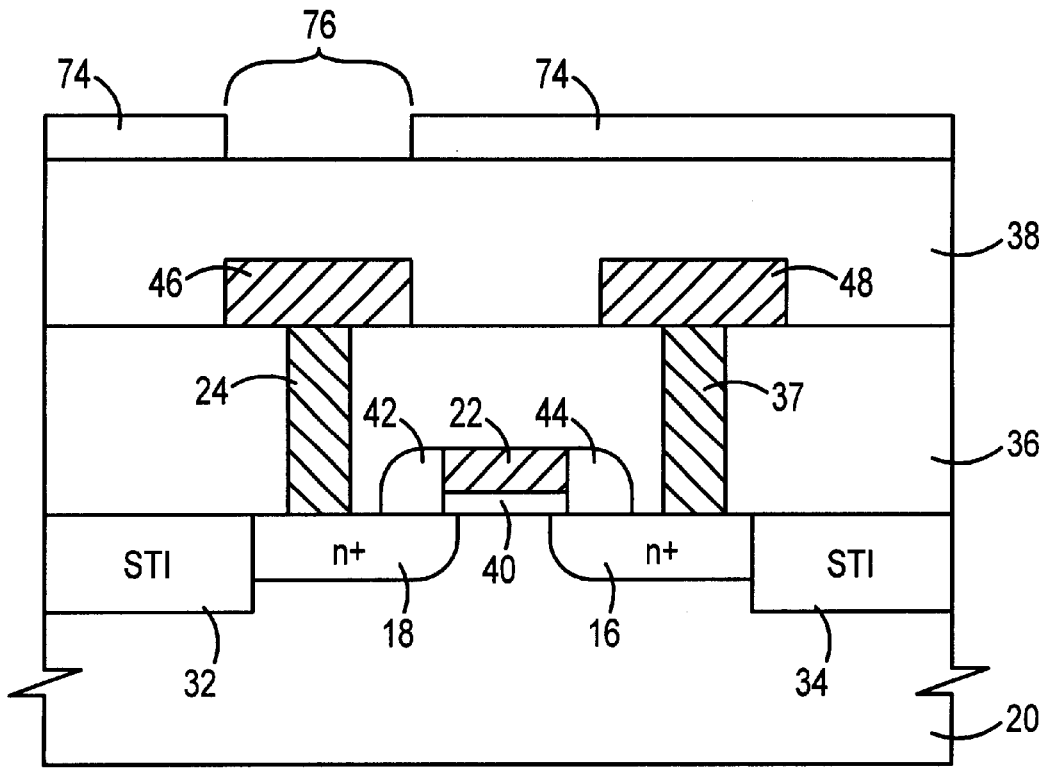
Figure 8:
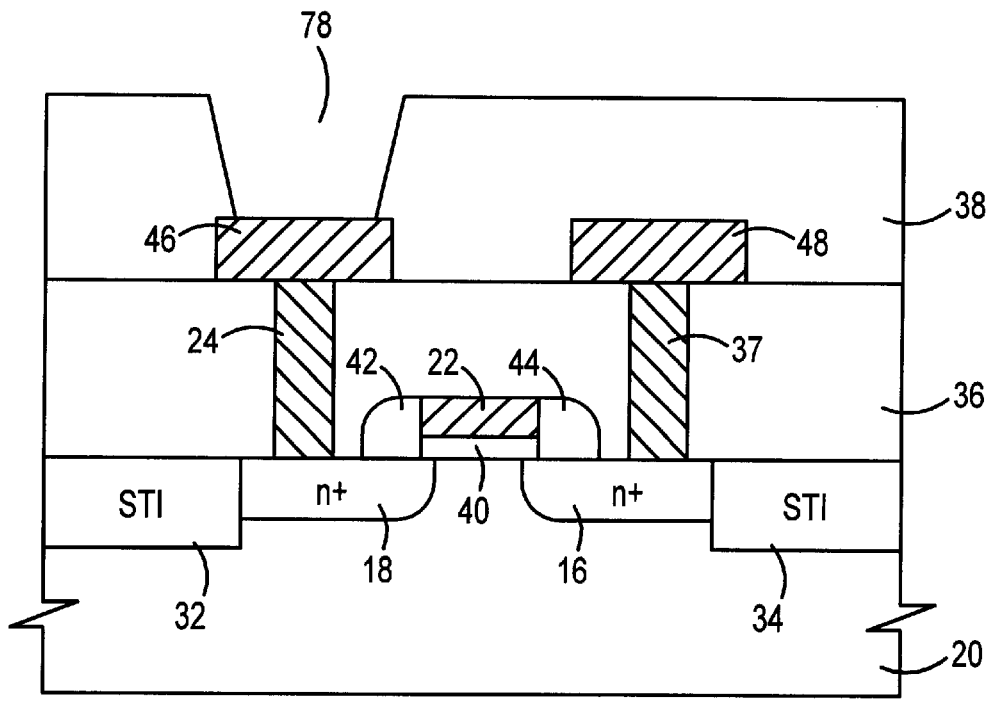

After the planarization of dielectric layer 38, a photoresist layer 74 is deposited over the dielectric layer 38 and patterned, creating an exposed region 76, as shown in FIG. 7. The exposed region 76 preferably defines a circular area with a diameter of approximately 0.8 μm, but this is not critical. As shown in FIG. 8, a cavity 78 is then formed by etching away a portion of the dielectric layer 38 that has been exposed by the region 76 of the photoresist layer 74. As an example, the cavity 78 may be formed by a plasma etching process. Preferably, the etched cavity 78 is in a bucket-like shape, having a larger opening at the top and tapering sidewalls. The cavity 78 may have a diameter of approximately 0.8 μm at the top and may narrow to a diameter of approximately 0.4 μm at the bottom. After the cavity 78 has been formed, the patterned photoresist layer 74 is removed.

Figure 9:
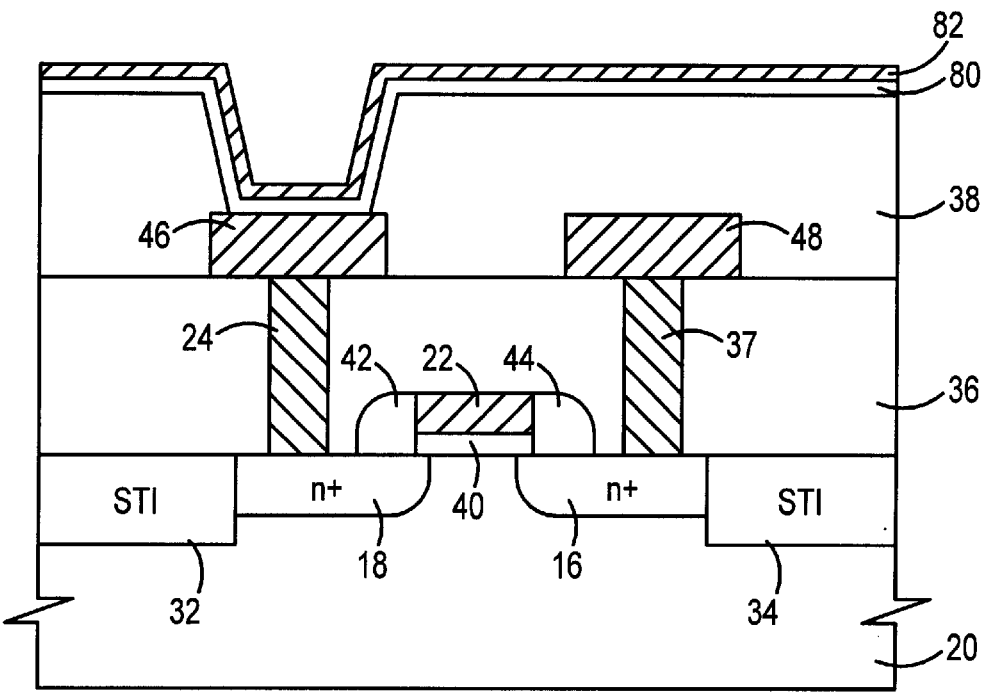

Referring now to FIG. 9, a layer of TiN 80 is deposited onto the dielectric layer 38 such that the layer of TiN covers the bottom and sidewalls of the cavity 78 to form the conductive adhesive layer 50. A layer of Pt 82 is then deposited onto the layer of TiN 80 to form the bottom electrode 26. The deposition of TiN and Pt is preferably accomplished by sputtering the TiN or Pt onto a target surface. The layer of TiN 80 may have a thickness of approximately 400 Angstroms, while the layer of Pt 82 may have a thickness of approximately 1,000 Angstroms.

Figure 10:
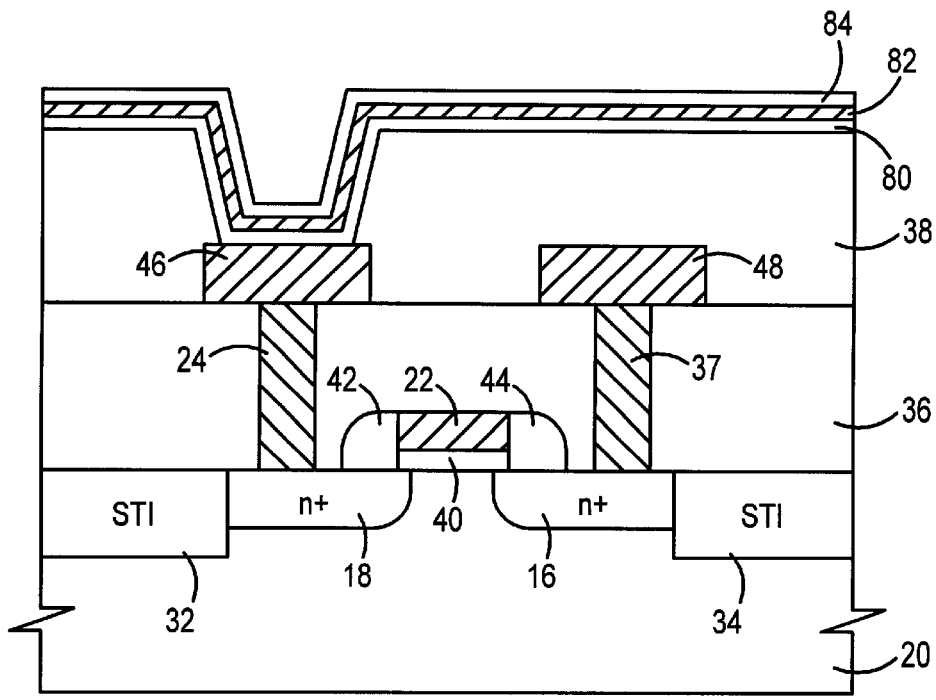
Figure 11:
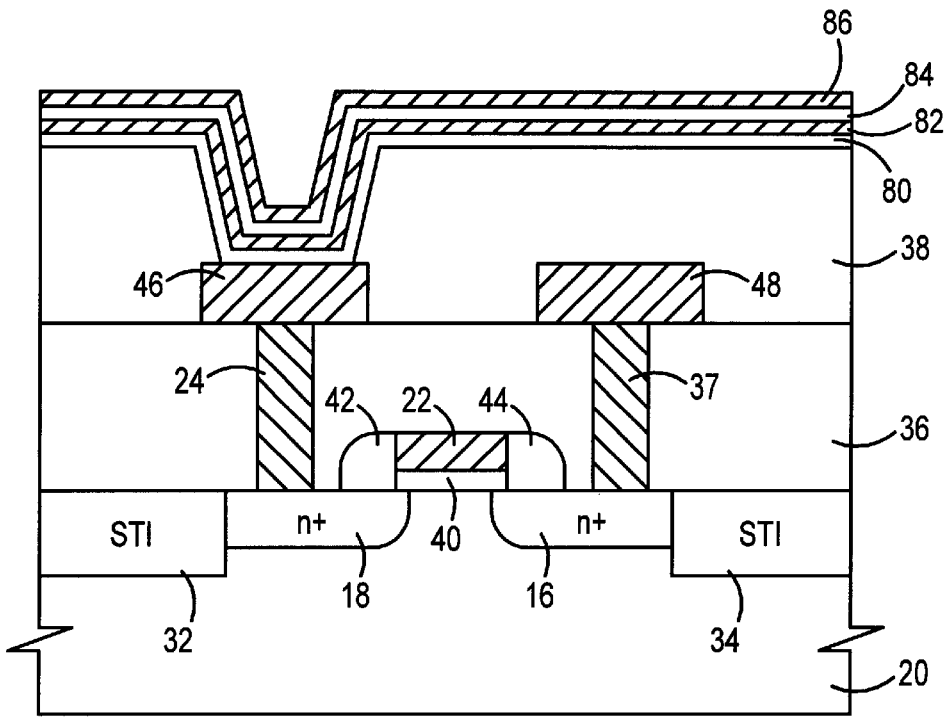

After the deposition of Pt, a layer of PZT 84 is deposited over the layer of Pt 82 to form the capacitor dielectric 28, as shown in FIG. 10. Preferably, the PZT is formed by a Metal Organic Chemical Vapor Deposition (MOCVD) process. The layer of PZT 84 may have a thickness of approximately 1,000 Angstroms. Next, a layer of Pt 86 is. deposited over the layer of PZT 84, as shown in FIG. 11. Similar to the layer of Pt 82, the layer of Pt 86 may be formed by sputtering Pt onto the layer of PZT 84 to a thickness of approximately 1,000 Angstroms.

Figure 12:
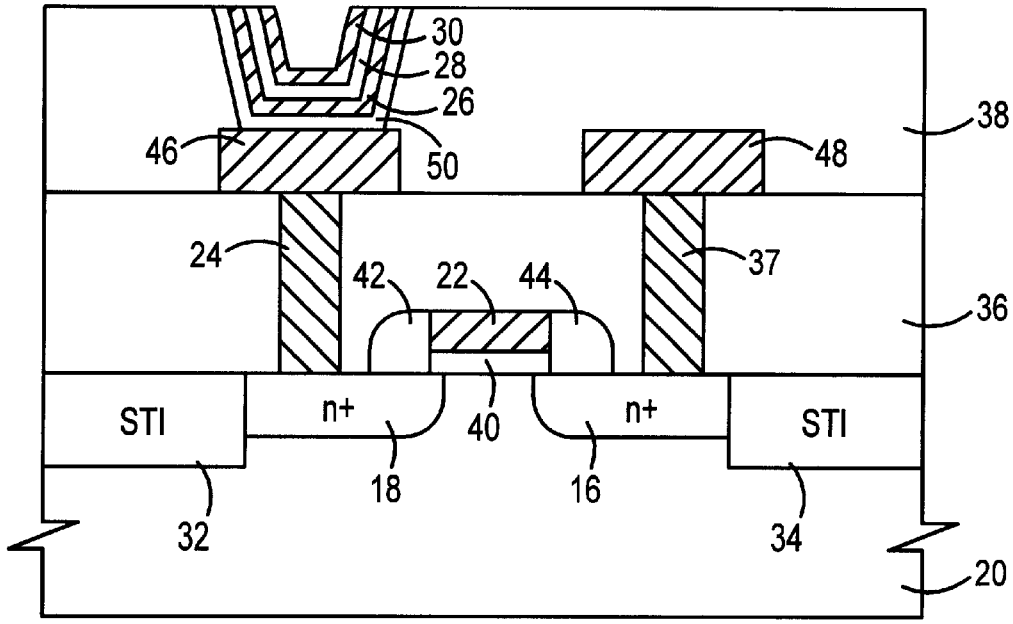

Following the formation of Pt layer 86, portions of layers 80–86 not within the cavity 78 are removed, as shown in FIG. 12. Preferably, the portions of layers 80–86 are removed by polishing the layers 80–86 down to the dielectric layer 38 by a CMP process. An acidic slurry is utilized for the CMP process. The CMP process effectively planarizes the surface down to the upper surface of the dielectric layer 38. The polished surface is then cleaned in a mechanical scrubber and any residual slurry particles are removed by a sputter etch-back process. The remaining portions of layers 80–86 are the conductive adhesive layer 50, the bottom electrode 26, the capacitor dielectric 28, and the top electrodes 30, respectively. In an alternative method, a sputter etch-back process may be utilized instead of the CMP process to remove the portions of layers 80–86.

Figure 13:
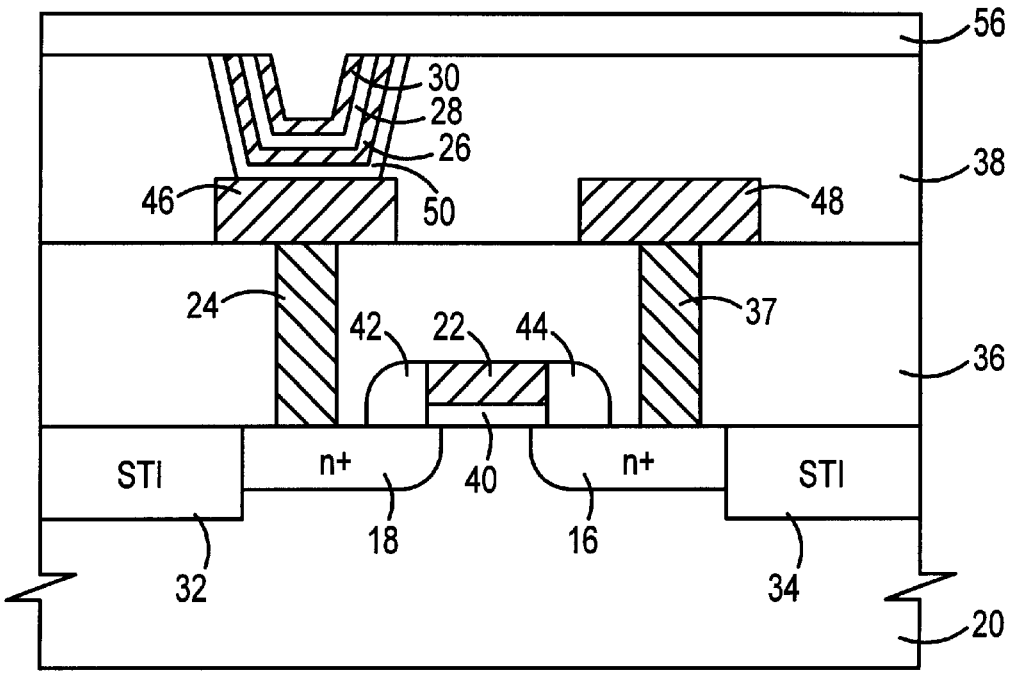
Figure 14:
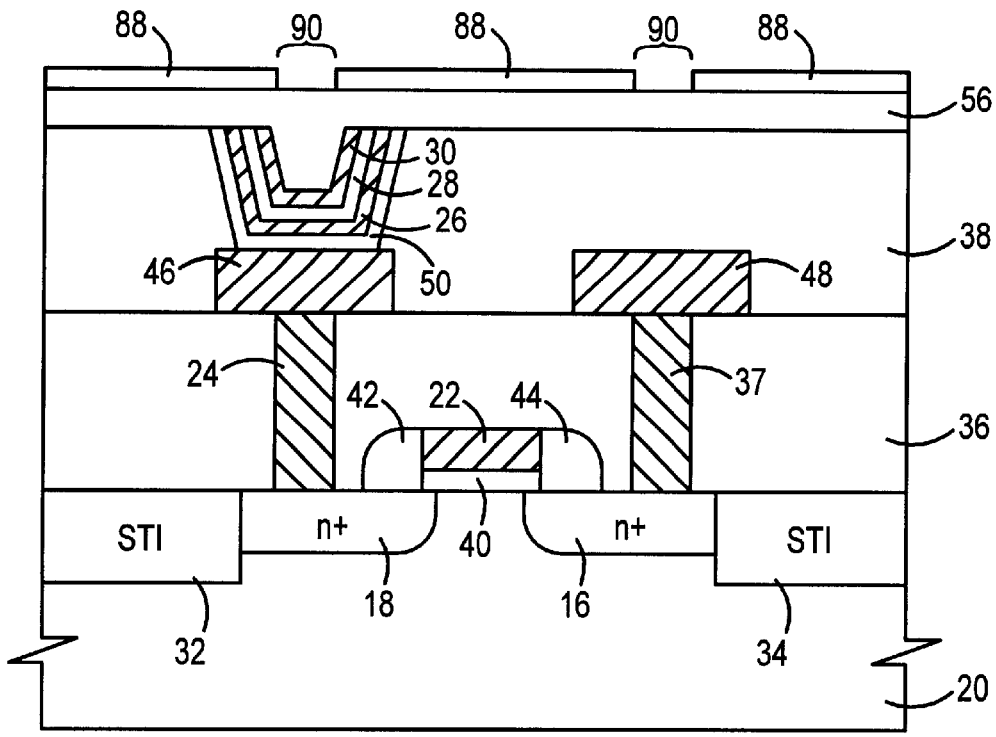
Figure 15:
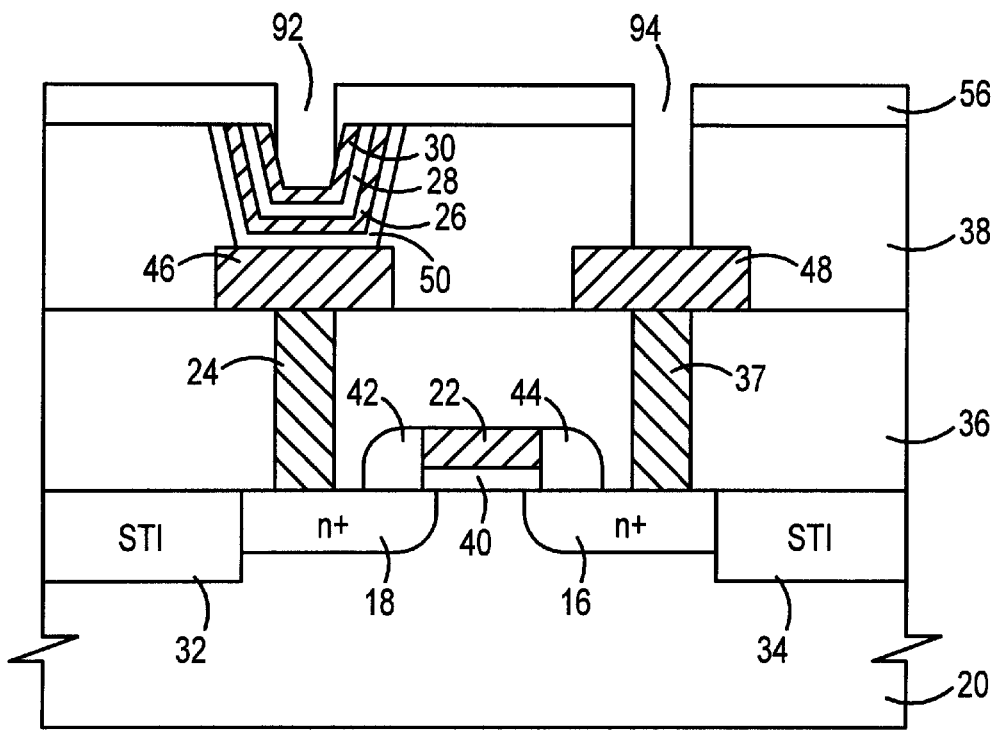

Referring now to FIG. 13, a layer of oxide is deposited over the dielectric layer 38 to form the diffusion layer 56. After the formation of diffusion layer 56, a photoresist layer 88 is deposited over the diffusion layer 56 and patterned to create exposed regions 90. The patterned photoresist layer 88 is illustrated in FIG. 14. The patterned photoresist layer 88 is utilized to etch vias 92 and 94, as shown in FIG. 15. Preferably, the vias 92 and 94 are formed by a plasma etching process. The via 92 extends through the diffusion layer 56 down to the top electrode 30, while the via 94 extends down to the conductive connector 48.

Figure 16:
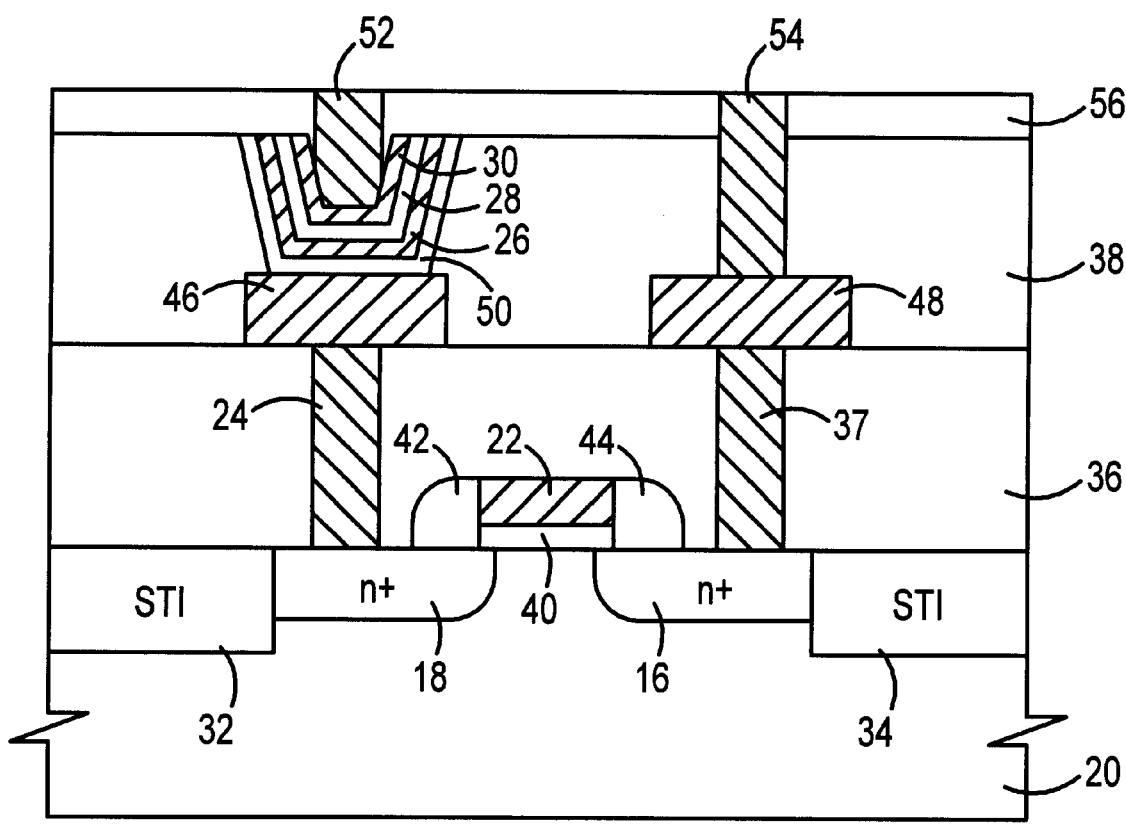
Figure 17:
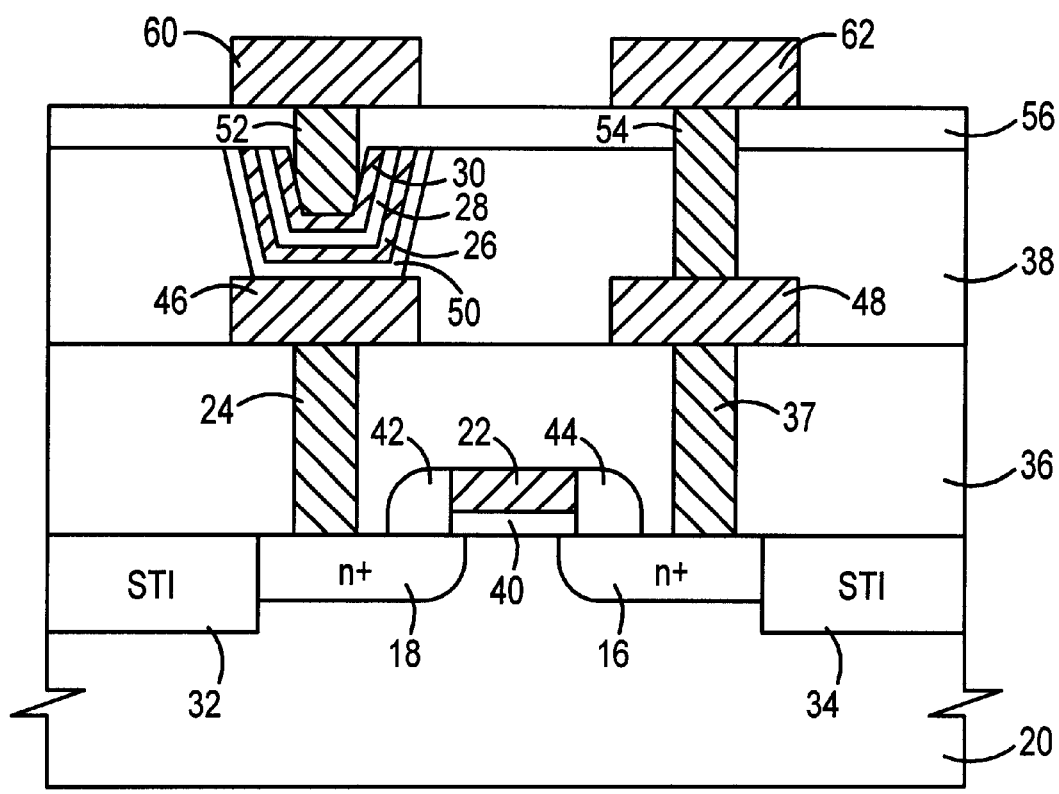

After the vias 92 and 94 have been formed, the vias 92 and 94 are filled with W to form the contact plugs 52 and 54 of FIG. 16. Next, the layers of TiN and W are polished down to the surface of the diffusion layer 56 by employing a CMP process. A layer of Al is deposited over the diffusion layer 56 and then etched to form the drive line 60 and the conductive connector 62, as shown in FIG. 17.

Figure 18:
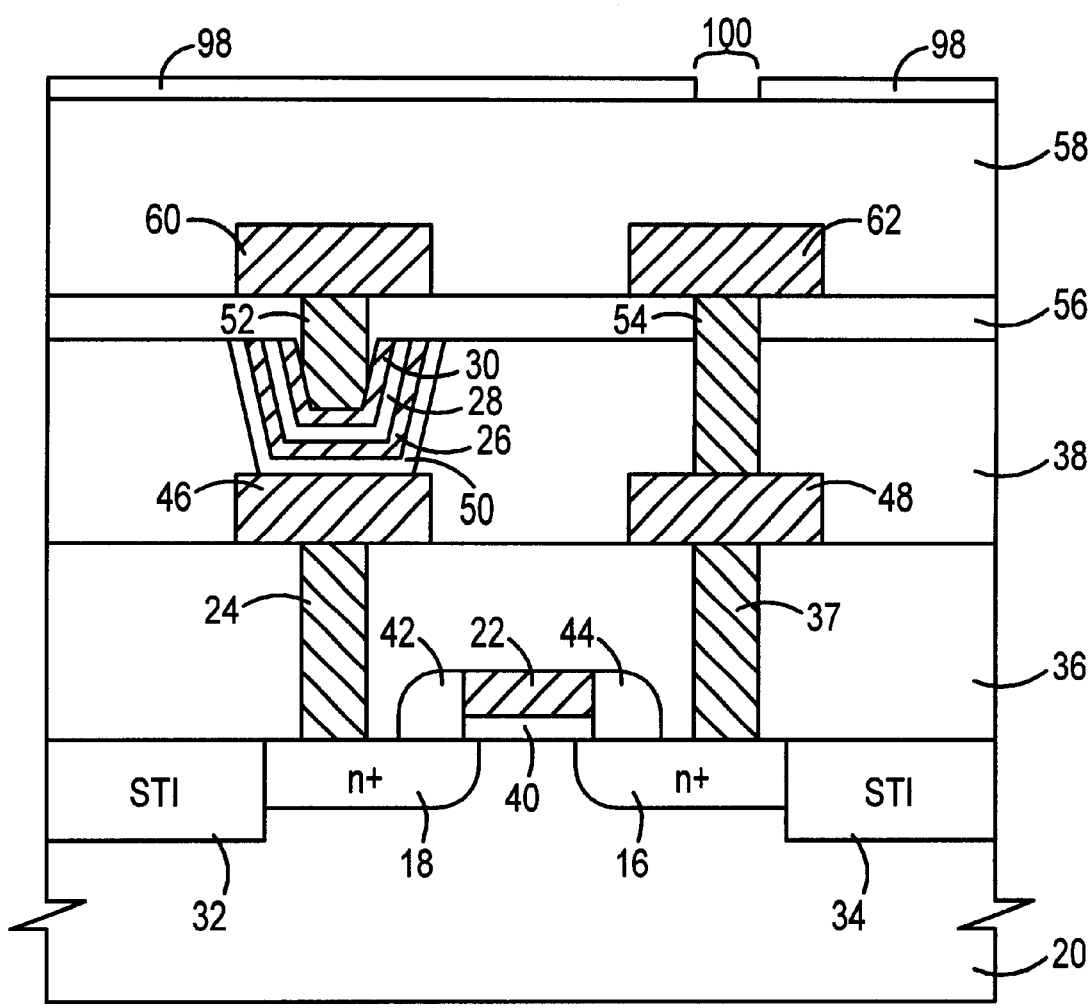
Figure 19:
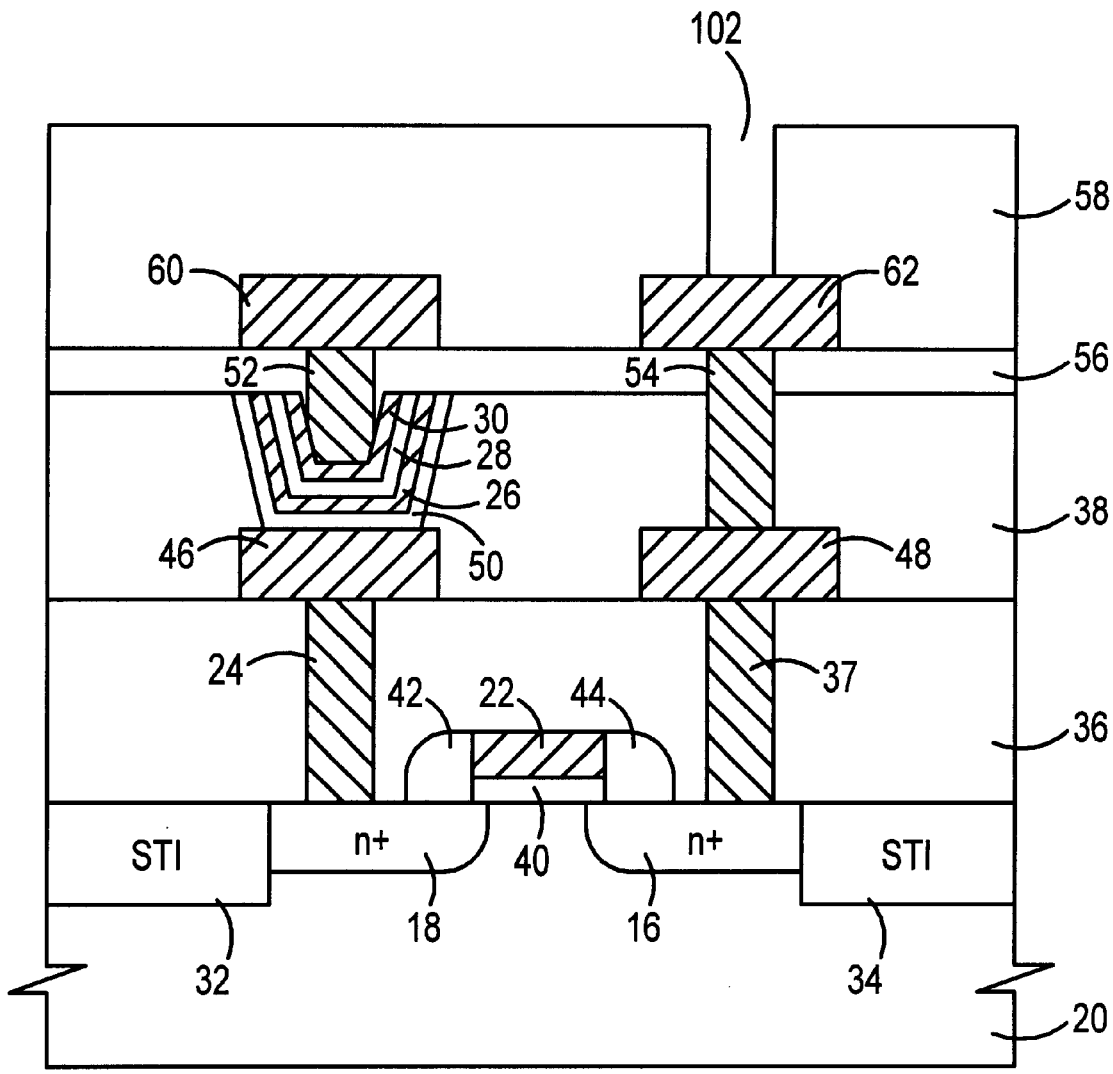
Figure 20:
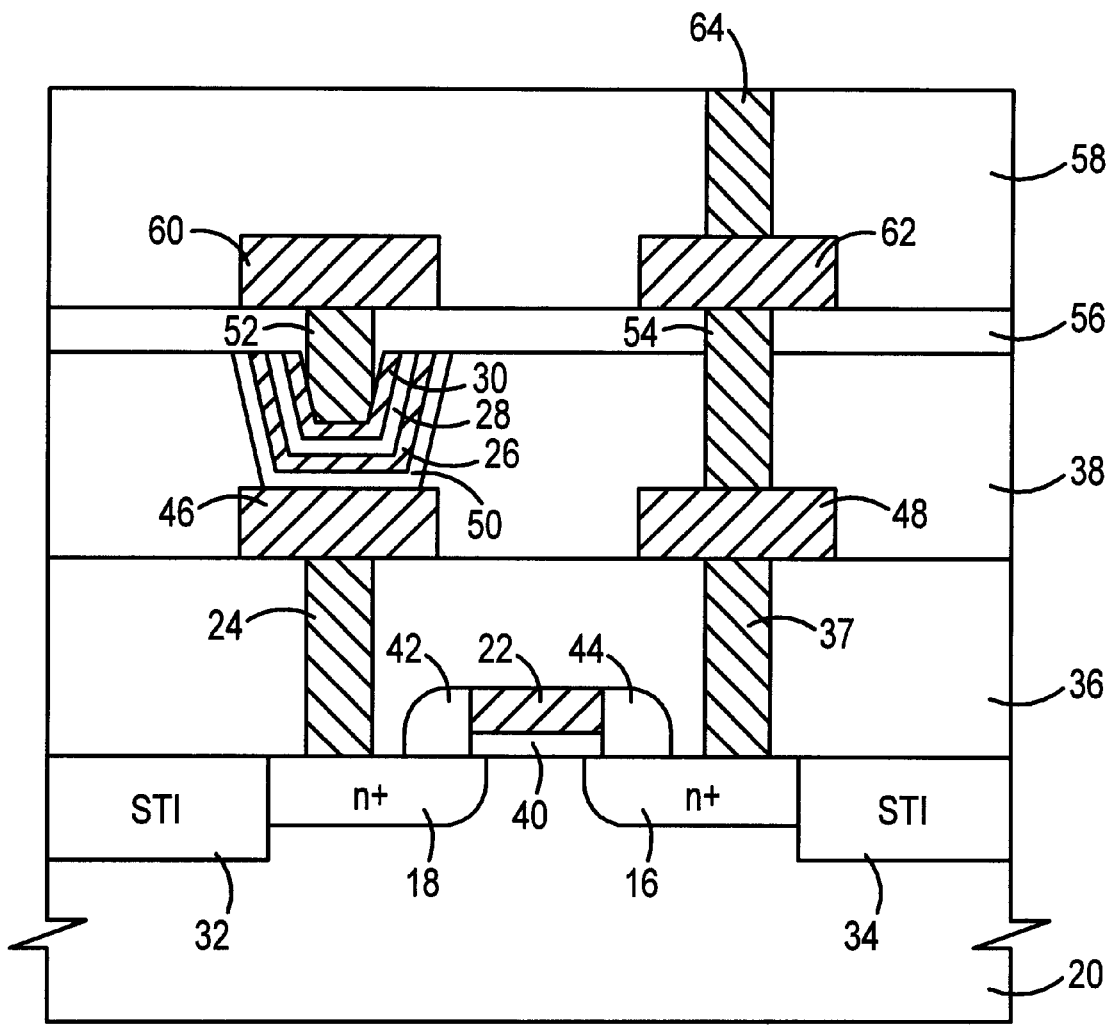
Figure 21:
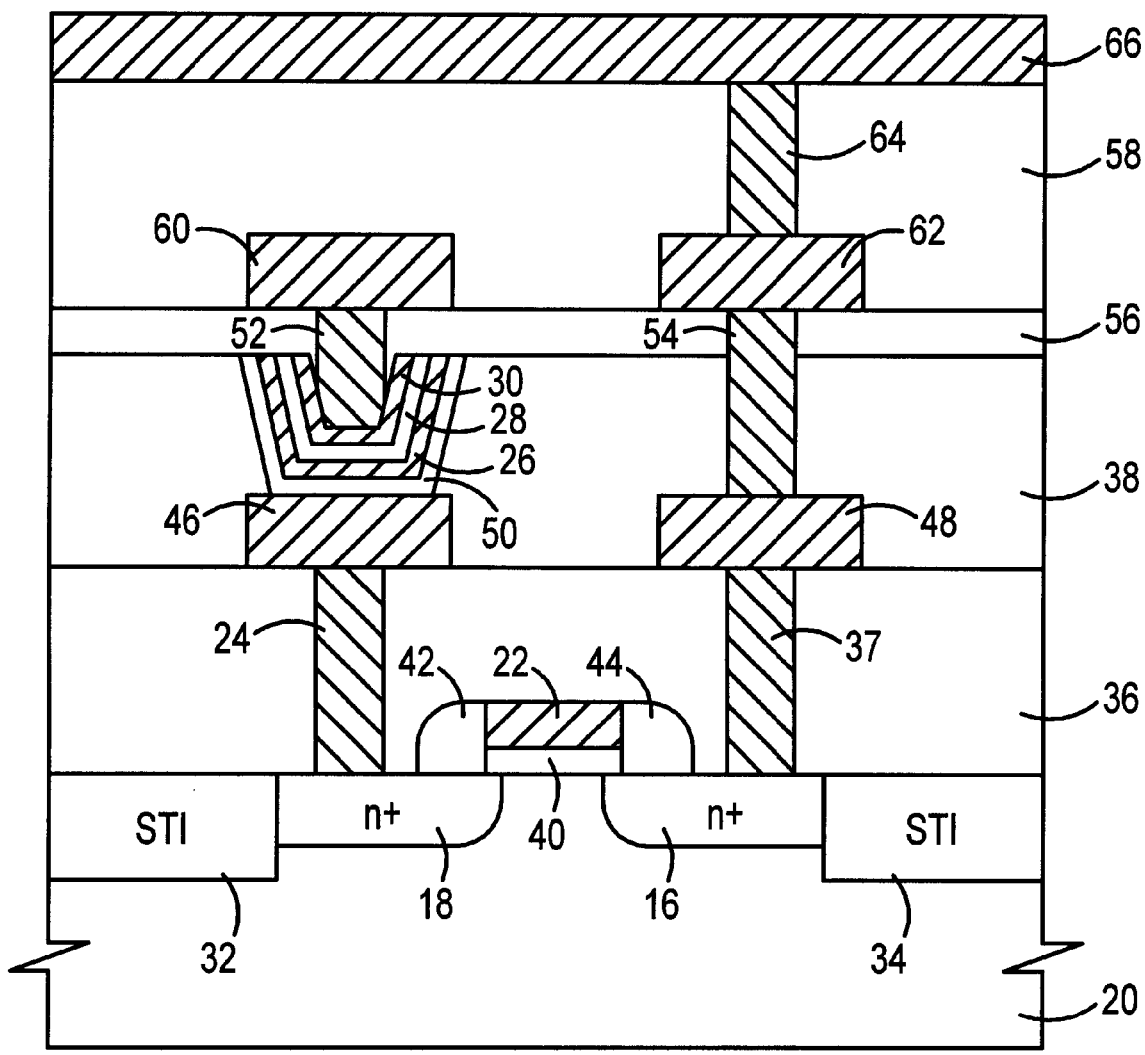

A layer of oxide is deposited over the diffusion layer 56 to form the dielectric layer 58, as shown in FIG. 18. A photoresist layer 98 is then deposited over the dielectric layer 58 and patterned. The patterned photoresist layer 98 includes an exposed region 100. Using the patterned photoresist layer 98, the dielectric layer 58 is etched to form a via 102 that has been outlined by the region 100, as shown in FIG. 19. After the formation of the via 102, a layer of W is deposited over the dielectric layer 58, filling in the via 102 with W. Next, the layer of W is polished down by a CMP process to remove excess W on the surface of the dielectric layer 58 and above the vias 102, as shown in FIG. 20. A layer of Al is then deposited and patterned over the dielectric layer 58 to form the bit line 66, as illustrated in FIG. 21.

Although the capacitor structure 12 has been described as being incorporated into a one-transistor-one-capacitor nonvolatile memory cell, the capacitor structure 12 can be incorporated into other semiconductor devices that include one or more capacitor structures. In addition, specific materials utilized to fabricate the capacitor structure 12 may be interchanged with comparable materials. In particular, the electrodes 26 and 30 may be formed by depositing Ru, $RuO_2$, Ir, $IrO_2$ or TaN, and the capacitor dielectric 28 may be formed by depositing BST.

What is claimed is:

1. A capacitor structure for an integrated circuit comprising:
    an inner electrode having a first rim, at least a portion of said inner electrode having a contour which tapers with distance from said first rim, said inner electrode having an interior and an exterior;
    a dielectric layer extending along said exterior of said inner electrode;
    an outer electrode having a second rim that is substantially coplanar with said first rim, said outer electrode being isolated from said inner electrode by said dielectric layer;
    a storage plug conductively coupled to said outer electrode;
    a metal connector positioned between said outer electrode and said storage plug such that said inner electrode, said dielectric layers and said outer electrode are situated within a stratum at a level above said metal connector; and
    connections to said inner electrode and said storage plug for storing an electrical charge by applying a potential difference and for reading said stored electrical charge.

2. The capacitor structure of claim 1 wherein said dielectric layer has a third rim that is substantially coplanar with said first and second rims, said dielectric layer thereby being coterminous with said inner and outer electrodes.

3. The capacitor structure of claim 1 wherein said outer electrode has a container-like configuration with an interior surface having a shape that is consistent with said contour of said inner electrode, such that a spacing between said inner and outer electrodes remains substantially equal along said interior surface.

4. The capacitor structure of claim 3 wherein said dielectric layer has an axis that is coaxial with said container-like configuration and with said inner electrode.

5. The capacitor structure of claim 1 wherein said connections include a top plug extending into an interior of said inner electrode.

6. The capacitor structure of claim 5 further comprising a substrate and a transistor formed in said substrate, said transistor being electrically coupled to said storage plug to regulate said storing and said reading of said stored electrical charge.

7. The capacitor structure of claim 6 wherein an L-shaped configuration is defined as having a base formed by said transistor and a leg formed by a path that includes said top and storage plugs and said inner and outer electrodes.

8. The capacitor structure of claim 1 further comprising an adhesive layer on a surface of said outer electrode.

9. The capacitor structure of claim 1 wherein said dielectric layer is formed of a ferroelectric material and said inner and outer electrodes are formed of a conductive material selected from a group consisting of platinum, ruthenium, ruthenium oxide, iridium, iridium oxide, and tantalum nitride.

10. The capacitor structure of claim 1 further comprising a dielectric stratum connected to said outer electrode such that said inner electrode, said dielectric layer and said outer electrode are embedded within said dielectric stratum.

11. An array of capacitors for an integrated circuit, each capacitor comprising:
- a top electrode plate embedded in a first layer of a semiconductor structure, said top electrode plate generally conforming a shape of a downwardly tapering cavity containing said top electrode such that edges of said top electrode plate are substantially coplanar with an upper surface of said first layer, said top electrode plate being an isolated structure with respect to top electrode plates of other capacitors of said array;
- a bottom electrode plate positioned below said top electrode plate within said cavity, said bottom electrode plate generally conforming to said contours of said cavity such that edges of said bottom electrode plate are substantially coplanar with said upper surface of said first layer;
- a layer of dielectric material located between said top electrode plate and said bottom electrode plate;
- a storage node conductively coupled to said bottom electrode plate, said storage node being made of a conductive material to hold an electrical charge when a potential difference is applied to said top electrode plate and said bottom electrode plate; and
- a metal connector positioned between said bottom electrode plate and said storage node such that said top electrode plate, said layer of dielectric material and said bottom electrode plate are situated within said first layer at a level above said metal connector.

12. The array of claim 11 wherein said layer of dielectric material is a layer of ferroelectric material.

13. The array of claim 11 wherein said top electrode plate and said bottom electrode plate are made of a material selected from a group consisting of platinum, ruthenium, ruthenium oxide, iridium, iridium oxide, and tantalum nitride.

14. The array of claim 11 further comprising a transistor formed in said semiconductor structure at a level below said first layer and aligned with said storage node of a particular capacitor of said array to form an L-shaped arrangement, said transistor having an active mode in which said storage node of said particular capacitor is coupled to circuitry for applying said potential difference and for reading said electrical charge.

15. The capacitor structure of claim 1 wherein said storage plug is made of tungsten, and wherein said metal connector is made of aluminum.

16. The capacitor structure of claim 7 wherein said inner electrode, said dielectric layer, and said outer electrode are positioned within a first dielectric layer, said capacitor structure further comprising:
- a first metal layer positioned above said first dielectric layer, said first metal layer having a first patterned conductive trace that is electrically coupled to said inner electrode;
- a second dielectric layer positioned above said first metal layer; and
- a second metal layer positioned above said second dielectric layer, said second metal layer having a second patterned conductive trace that is electrically coupled to said transistor.

17. The array of claim 11 wherein said storage node is made of tungsten, and wherein said metal connector is made of aluminum.

18. The array of claim 14 wherein said first layer of said semiconductor structure is a first dielectric layer, said array further comprising:
- a first metal layer positioned above said first dielectric layer, said first metal layer having a first patterned conductive trace that is electrically coupled to said top electrode plate of said particular capacitor;
- a second dielectric layer positioned above said first metal layer; and
- a second metal layer positioned above said second dielectric layer, said second metal layer having a second patterned conductive trace that is electrically coupled to said transistor.

* * * * *